United States Patent [19]

Ziger

[11] Patent Number: 5,272,118
[45] Date of Patent: Dec. 21, 1993

[54] PHOTOLITHOGRAPHIC MASKING PROCESS

[75] Inventor: David H. Ziger, San Antonio, Tex.

[73] Assignee: AT&T Bell Laboratories, Murray Hill, N.J.

[21] Appl. No.: 983,195

[22] Filed: Nov. 30, 1992

Related U.S. Application Data

[62] Division of Ser. No. 652,826, Mar. 14, 1991, Pat. No. 5,205,867, which is a division of Ser. No. 396,200, Aug. 21, 1989, Pat. No. 5,032,492.

[51] Int. Cl.$^5$ .......................................... H01L 21/469
[52] U.S. Cl. ................................... 437/231; 437/228; 430/935
[58] Field of Search ............... 437/231, 227, 228, 225; 427/240, 385.5, 425; 118/52, 56; 148/DIG. 17; 430/325, 327, 935; 51/131.1–131.5

[56] References Cited

U.S. PATENT DOCUMENTS

| | | | |
|---|---|---|---|
| 3,834,613 | 9/1974 | Hankey | 118/52 |
| 4,267,212 | 5/1981 | Sakawaki | 427/240 |
| 4,457,259 | 7/1984 | Samuels | 118/705 |

Primary Examiner—Olik Chaudhuri
Assistant Examiner—H. Jey Tsai
Attorney, Agent, or Firm—Roderick B. Anderson

[57] ABSTRACT

A semiconductor wafer 11 is mounted on an elongated member 18, one end of which is rotatable about a transverse axis (14), thereby to distribute a liquid on the upper surface of the wafer more evenly. In order to stabilize the rotation of the elongated member, a second elongated member is preferably attached end-to-end to the elongated member (18) and rotates with it. A counterweight (26) in the second elongated member moves during the rotation such that the distance between the wafer and the central axis and the distance between the center of the counterweight and the axis are substantially equal. The weight distribution is approximately symmetrical about the axis and the structure is dynamically stabilized. The counterweight and the wafer assembly may be moved during rotation by applying air pressure from a source (23) to pistons (13, 26) in the two elongated members.

4 Claims, 4 Drawing Sheets

PHOTOLITHOGRAPHIC MASKING PROCESS

This is a division of application Ser. No. 07/652,826, filed Mar. 14, 1991, now U.S. Pat. No. 5,205,867, which in turn is a division of application Ser. No. 396,200, filed Aug. 21, 1989, now U.S. Pat. No. 5,032,492, granted Jul. 16, 1991.

TECHNICAL FIELD

This invention relates to methods and apparatus for making integrated circuits and, more particularly, to methods and apparatus for distributing a liquid such as a photoresist uniformly on the upper surface of a semiconductor wafer.

BACKGROUND OF THE INVENTION

Semiconductor integrated circuit device fabrication normally requires repeated processes of photolithographic masking and etching on an upper surface of a wafer of a semiconductor material such as silicon. Each of these processes requires spreading a thin layer of a liquid photoresist material on the surface of the wafer, selectively exposing it through a mask to actinic light, developing the photoresist to define a mask pattern on the wafer surface and using this mask pattern to describe a permanent pattern on the wafer. The permanent pattern on the wafer may in turn be used to control selective etching, diffusion, ion implantation, metal deposition, oxide deposition, and other processes that describe the finished integrated circuit.

As integrated circuits have become more complex, the requirements for accuracy and resolution of the photolithographic processing have become more stringent. Requirements for line-width definition of less than one micron are becoming increasingly commonplace. As a consequence, greater accuracy is required at all stages of the photolithographic processing.

The liquid photoresist is typically dispensed on one surface of the wafer with the wafer being held in a vacuum chuck that is subsequently rotated to disperse the liquid over the entire surface. While this method is suitable for many purposes, it does tend to result in non-uniformities in thickness of the photoresist that can affect the uniformity and consequent accuracy of the resulting pattern to be developed. Development of the photoresist likewise requires a uniform distribution of developing fluid for a uniform development of the desired pattern. Finally, the steps of stripping photoresist, liquid etching, and cleaning of the wafer all require a uniform distribution of fluid. The effects of non-uniform distribution of any of these liquids can be somewhat overcome by dispensing rather large amounts of the liquid at different locations over the surface, but in the mass-production of integrated circuits, this solution can be quite wasteful of the liquid and therefore expensive, and in any event, it only reduces rather eliminates coating thickness non-uniformities.

SUMMARY OF THE INVENTION

During the rotation of the wafer, distribution of a liquid on its surface is made more uniform by moving the axis of the rotation of the wafer during such rotation. The rotational axis can be varied so as to be at any location on the wafer or at a location outside the surface of the wafer.

In apparatus for practicing the invention, the wafer is mounted on an elongated member, one end of which is rotatable about a transverse axis. A support member for the wafer is mounted on the elongated member such as to move controllably along the elongated member during its rotation, thereby moving the location of the wafer relative to the axis of rotation during wafer rotation. In order to stabilize the rotation of the elongated member, a second elongated member is preferably attached end-to-end to the elongated member and rotates with it. A counterweight in the second elongated member moves during the rotation such that the distance between the wafer and the central axis and the distance between the center of the counterweight and the axis are substantially equal. With the counterweight weighing approximately the same as the wafer and associated assembly, the weight distribution is approximately symmetrical about the axis, and the structure is dynamically stabilized. Both the counterweight and the wafer assembly may be moved during rotation by applying air pressure to pistons in the two elongated members as will be described more fully below.

These and other objects, features and advantages of the invention will be better understood from a consideration of the following detailed description taken in conjunction with the accompanying drawing in which:

DETAILED DESCRIPTION

Figure 1:
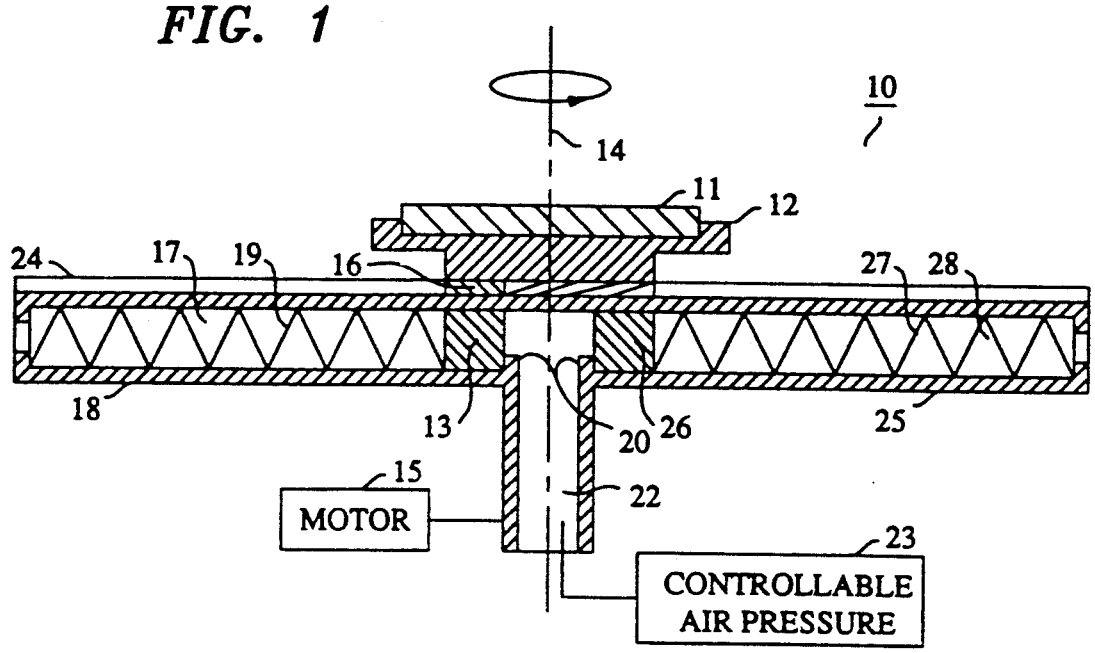
FIG. 1 is a schematic view of apparatus for distributing fluid on the surface of a semiconductor wafer in accordance with an illustrative embodiment of the invention.
Figure 2:
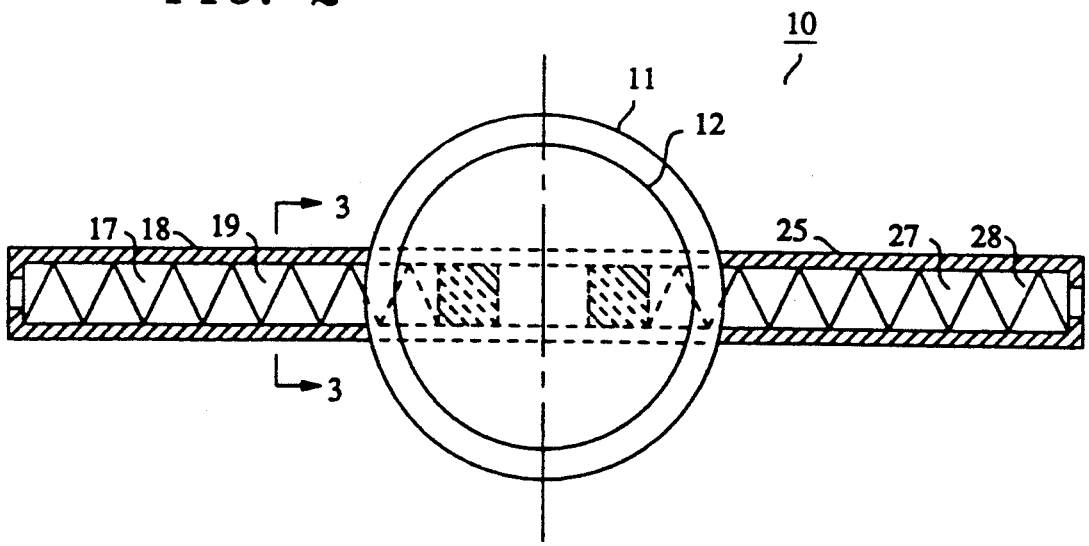
FIG. 2 is a top view of FIG. 1.

Referring now to FIGS. 1 and 2, there is shown schematically apparatus 10 for distributing a liquid on the upper surface of a semiconductor wafer 11 in accordance with an illustrative embodiment of the invention. The wafer 11 is mounted on a wafer holder 12 which is rigidly coupled to a piston 13. Piston 13 and holder 12 may include permanent magnets which provide the rigid coupling. For example, a magnet portion 16 of the wafer holder may be a rare earth permanent magnet which is attracted strongly to a permanent magnet in the piston 13. The entire assembly 10 is rotatable about the central axis 14 by a motor schematically shown as 15. Any fluid such as photoresist liquid that has been dispensed on the upper surface of the wafer 11 will then be distributed about the upper surface in the conventional manner.

While such liquid distribution has been successfully used for years in the semiconductor industry, it can be shown that such distribution normally results in non-uniformities in the thickness of the distributed liquid coating. This can be appreciated by considering that the tangential velocity v at any point on the wafer is a function of distance from the central axis, or, $$v = \omega r^2 \qquad (1)$$

where ω is the angular velocity of the wafer, and r is the distance of the location under consideration from the central axis. It can be seen that, at the central axis, the tangential velocity is zero and there is therefore no centrifugal force to cause the liquid to be distributed. As the distance from the center increases, the tangential velocity increases, thereby exerting greater centrifugal force on the liquid to be distributed and causing it to be distributed progressively more thinly.

The purpose of the apparatus of FIG. 1 is to cause the axis of rotation of the wafer to be varied with respect to the wafer during its rotation and thereby make the liquid distribution more uniform. The piston 13 is located within a cylindrical passage 17 of a first elongated member 18. In the position shown, a spring 19 bears against one side of the piston and a stop 20 bears against its opposite side. Passage 17 is connected through a channel 22 and a rotatable pressure fitting (not shown) to a source of controllable air pressure 23. Channel 22 and passage 17 between piston 13 and channel 22 are airtight so that, when air pressure is applied from source 23, the piston 13 is forced against the bias of spring 19 along the elongated member 18.

Figure 4:
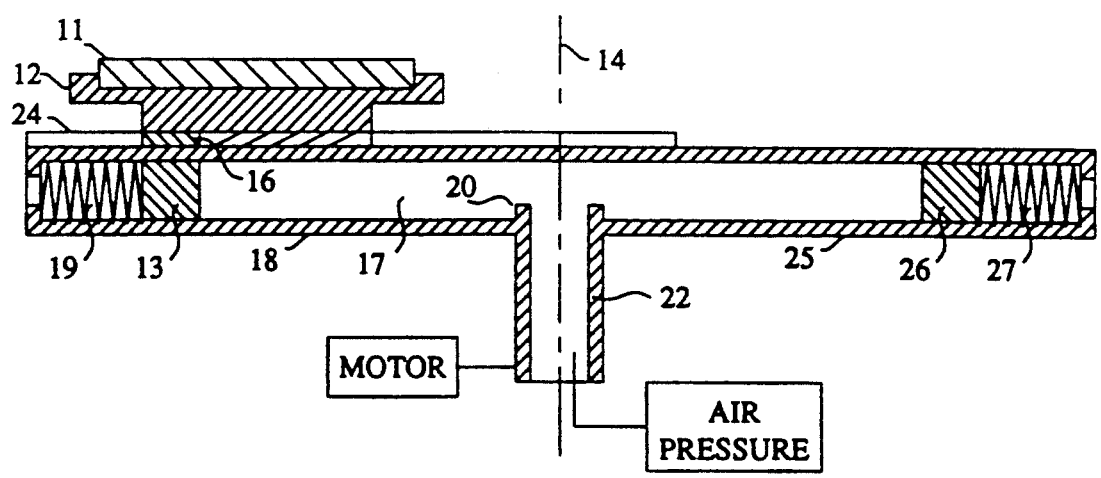
FIG. 4 is a sectional view of the apparatus of FIG. 1, but with the semiconductor wafer assembly in a different location.
Figure 5:
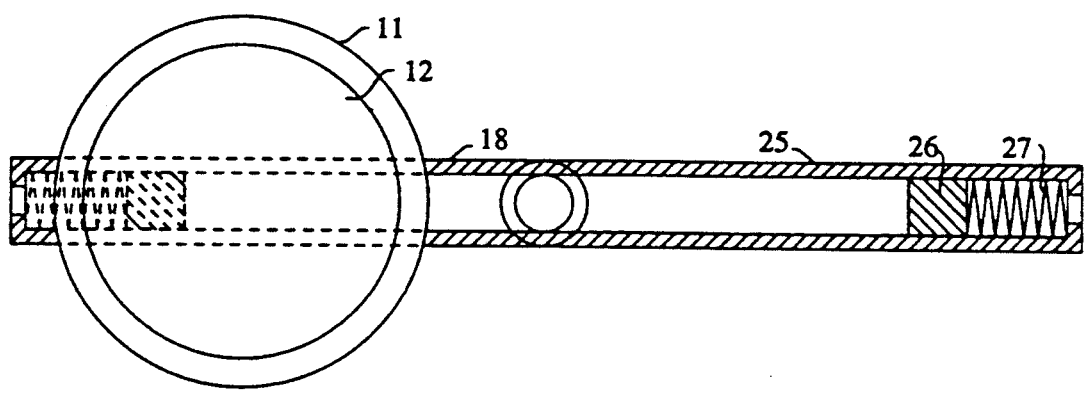
FIG. 5 is a top view of FIG. 4.

FIG. 4 shows the piston 13 in its extreme position due to the application of maximum air pressure. Wafer holder 12 is also located at the same extreme position because of its coupling with piston 13. To avoid any compression of air, the left end of member 18 should be open, or at least not be air-tight.

Figure 3:
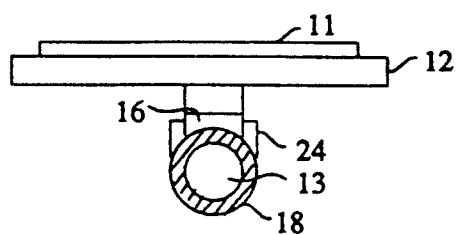
FIG. 3 is a view taken along lines 3—3 of FIG. 2.

As illustrated in FIG. 3, wafer holder 12 is free to move along the upper surface of elongated member 18 and is guided by a pair of tracks 24. Although the absolute location of the axis of rotation 14 does not change, one can see that in FIG. 4 the location of the axis of rotation of wafer 11 has changed. By moving the piston 13 along elongated member 18, one moves the axis of rotation of the wafer from a location at the center of the wafer as shown in FIG. 1 to a location outside the surface of the wafer 11 as shown in FIG. 4. (For purposes of this document, "rotation" of a body is intended to include movement about an axis that may be external of the body as well as an axis extending through the body. Also, movement of one body "relative" to another body is intended to imply that either body may be stationary.) As a consequence of relative movement of the central axis with respect to the wafer, one changes the angular velocity at various locations on the wafer and therefore the centrifugal forces on liquids on the surface of the wafer. These changes tend to make the distribution of the liquid on the surface more uniform. Specifically, they prevent a relative accumulation of liquid at the center of the wafer.

Referring again to FIG. 1, integrated with the elongated member 18 is a second elongated member 25 containing a piston 26 which is biased by a spring element 27. The central passage 28 of the second elongated member communicates with channel 22 and therefore with the controllable source of air pressure 23. Piston 26 is designed to have approximately the same weight as the combined weight of piston 13, holder 12 and wafer 11. As a consequence, the effect on piston 26 of the application of air pressure is the same as that on piston 13; and a piston 13 is driven by air pressure along member 18, piston 26 is driven an equal and opposite distance along second elongated member 25.

FIG. 4 shows pistons 13 and 26 after being driven an equal and opposite distance from center line 14. This has the effect of dynamically stabilizing the apparatus 10 by making symmetrical the loads on the apparatus during rotation about the central axis 14. As the air pressure is reduced, the springs drive pistons 13 and 26 back toward the center in precisely the same manner, thus to maintain stability. It should be noted that in FIG. 4 the sole rotation of wafer 11 is around central axis 14; i.e., there is no rotation of the wafer around an axis through its center.

The invention is particularly useful for distributing liquid photoresist along the top of the semiconductor wafer prior to selective exposure through a photomask to actinic light. After such exposure, a developing liquid is dispensed on the upper surface of the wafer and the wafer is again rotated with the apparatus shown, and with the method described above for distributing the developing fluid. The developing fluid reacts with the exposed photoresist so as to describe a pattern in accordance with the selective exposure of the photoresist to actinic light. The resulting mask over the surface of the wafer is thereafter used to control etching, diffusion, ion implantation, metal deposition, oxide deposition, and/or other processes that describe the finished integrated circuits. Uniform distribution in accordance with the invention gives the same relative resolution capabilities at all locations on the surface of the wafer, both during the exposure of the photoresist and during its development. After development, the invention may be used to distribute other liquids on the wafer surface, e.g., liquids for stripping photoresist, etchant liquids, and cleaning liquids may be distributed in this manner. In all such cases, the properties of the liquids is optimized and waste of the liquids are minimized for the reasons given above.

Because of the use of different fluids for different purposes, it may be desired that the wafer be rotated at any of various speeds between about 100 rotations per minute (rpm) and about 5000 rpm. At relatively lower speeds there should be no problem in operating the apparatus, but at higher speeds care should be taken that the magnetic attraction between piston 13 and wafer holder 12 is sufficient to overcome the centrifugal force on holder 12. If, due to the high speed desired for distribution of a particularly viscous liquid, one prefers that a direct mechanical connection be made between wafer holder 12 and piston 13, appropriate gaskets in a slot permitting such direct linkage may be provided. The gaskets would keep the part of passage 17 between piston 13 and channel 22 air-tight as is known in art.

Figure 6:
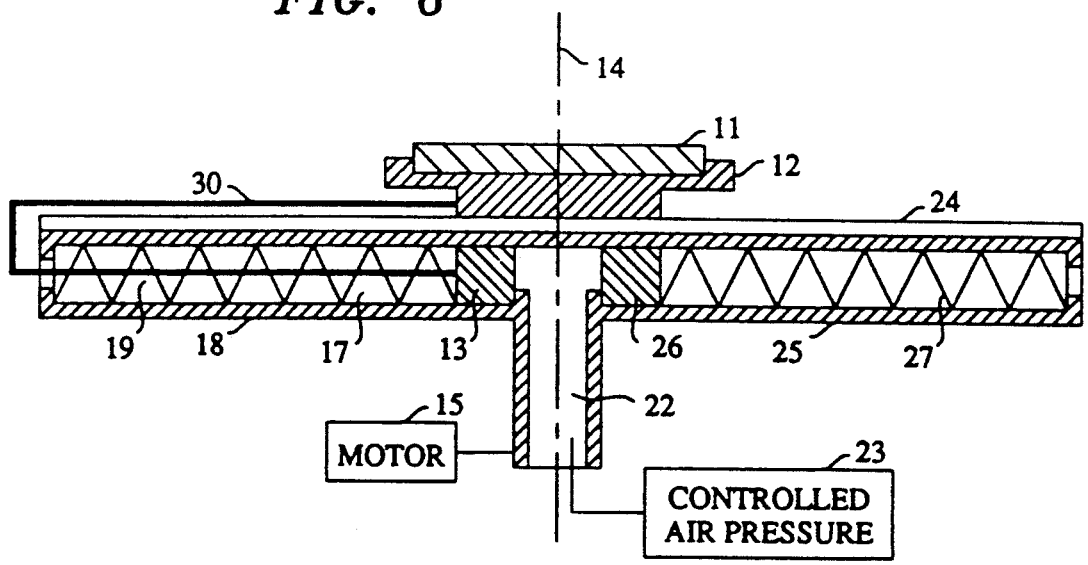
FIG. 6 is a schematic view of another embodiment of the invention.

FIG. 6 shows alternatively another method of mechanically directly attaching the piston 13 with the wafer holder 12. The reference numbers of FIG. 6 refer to elements that correspond to those having the same reference numbers of FIG. 1. Since the extreme left end of elongated member 18 may be open, one may easily include a rigid U-shaped coupling element 30 interconnecting piston 13 and wafer holder 12. As piston 13 is moved to the left, wafer holder 12 is likewise moved to the left as was described before; however, for the sake of brevity, separate drawings showing pistons 13 and 26 in the extreme positions, corresponding to FIG. 4, have not been shown. A U-shaped member which is part of the counterweight may be attached to piston 26 for greater mechanical symmetry if so desired.

Figure 7:
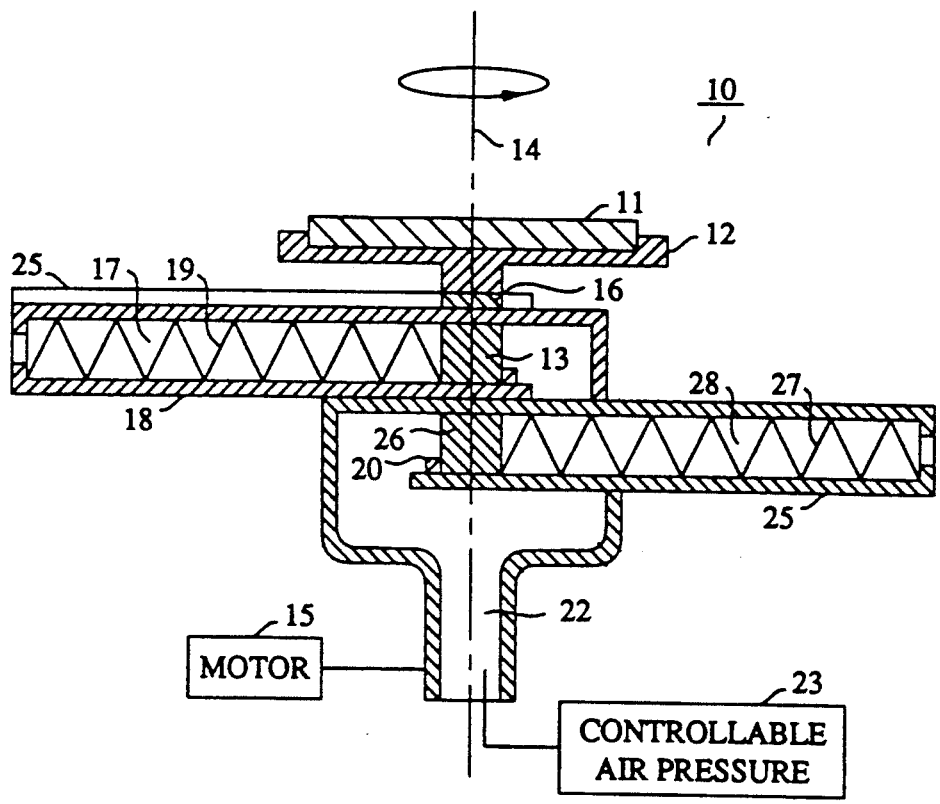
FIG. 7 is a schematic view of yet another embodiment of the invention.

Referring to FIG. 7 there is shown still another embodiment of the invention in which the first elongated element 18 has been axially displaced with respect to the second elongated element 25. The purpose of this arrangement is to permit pistons 13 and 26 to be axially aligned when there is no displacement of the wafer with respect to the central axis 14. This obviates the need for offsetting the major portion of the wafer holder 12 from magnet 16 as is required in the embodiment of FIG. 1 to permit alignment of the wafer with the central axis. In the design of FIG. 7, it is important that both central passages 17 and 28 communicate with channel 22 so as to permit equal forces on pistons 13 and 26 during application of the controllable air pressure.

It can be appreciated from the foregoing that a number of mechanical structures can be devised for moving the wafer 11 during the course of rotation. For example, instead of using air pressure to move the pistons, mechanically or electrically driven elements could be used. I have found that a counterweight structure is normally desirable to reduce mechanical wear of apparatus 10 during operation, although in principle, such counterweight structure is not required. If the wafer is mounted on a rotable disk that is much heavier than the wafer, the wafer could be moved radially along the disk during rotation without any compensating counterbalance. Various other embodiments and modifications may be devised by those skilled in the art without departing from the spirit and scope of the invention.

I claim:

1. A method for making semiconductor devices comprising the steps of dispensing a liquid on a surface of a semiconductor wafer; rotating the wafer to disperse the liquid, characterized in that:

during rotation, the wafer is moved relative to an axis about which the wafer rotates.

2. The method of claim 1 further characterized in that:

the wafer is mounted on a rotatable member;

the rotatable member is rotated, and, during such rotation, the wafer is moved with respect to the rotatable member.

3. The method of claim 2 further characterized in that:

a counterweight is mounted on the rotatable member;

and as the wafer is moved in one direction with respect to the axis of rotation of the rotatable member, the counterweight is moved in an opposite direction with respect to said axis of rotation.

4. The method of claim 3 further characterized in that:

the rotatable member has the shape of a cylinder;

the axis of rotation extends transverse to the axis of the cylinder;

the wafer is coupled to a first piston contained in the cylinder;

the counterweight is associated with a second piston contained in the cylinder;

and the step of moving the wafer and counterweight comprise the step of applying air pressure to the first and second pistons.

* * * * *